United States Patent [19]

Smothers

[11] Patent Number: 4,994,347
[45] Date of Patent: Feb. 19, 1991

[54] STORAGE STABLE PHOTOPOLYMERIZABLE COMPOSITION AND ELEMENT FOR REFRACTIVE INDEX IMAGING

[75] Inventor: William K. Smothers, Hockessin, Del.

[73] Assignee: E. I. du Pont de Nemours and Company, Wilmington, Del.

[21] Appl. No.: 288,916

[22] Filed: Dec. 23, 1988

Related U.S. Application Data

[63] Continuation-in-part of Ser. No. 144,281, Jan. 15, 1988, abandoned.

[51] Int. Cl.⁵ .............................................. G03C 7/028
[52] U.S. Cl. .................................... 430/282; 430/1; 430/2; 430/290; 430/920; 430/921; 430/916; 430/911; 430/909; 430/910; 430/912; 430/281
[58] Field of Search .................. 522/26, 27; 430/1, 2, 430/290, 282, 920, 921, 916, 911, 909, 910, 912, 281

[56] References Cited

U.S. PATENT DOCUMENTS

| | | | |
|---|---|---|---|
| 3,445,234 | 5/1969 | Cescon et al. | 96/90 |
| 3,479,185 | 11/1969 | Chambers | 96/84 |
| 3,658,526 | 4/1972 | Haugh | 96/27 |
| 4,273,857 | 6/1981 | Leberzammer et al. | 430/281 |
| 4,732,831 | 3/1988 | Riesenfeld et al. | 430/49 |

OTHER PUBLICATIONS

Gladden, James W., Review of Photosensitive Materials for Holographic Recordings, Apr. 1978, U.S. Army Corps of Engineers, ETL-0128, pp. 18-20.

Primary Examiner—Cynthia Hamilton

[57] ABSTRACT

Solid storage stable photopolymerizable compositions are provided that are useful in preparing optical elements, and especially holograms. The composition contains a polymeric binder, N-vinyl carbazole and a photoinitiator system that has a hydrogen donor component.

32 Claims, 1 Drawing Sheet

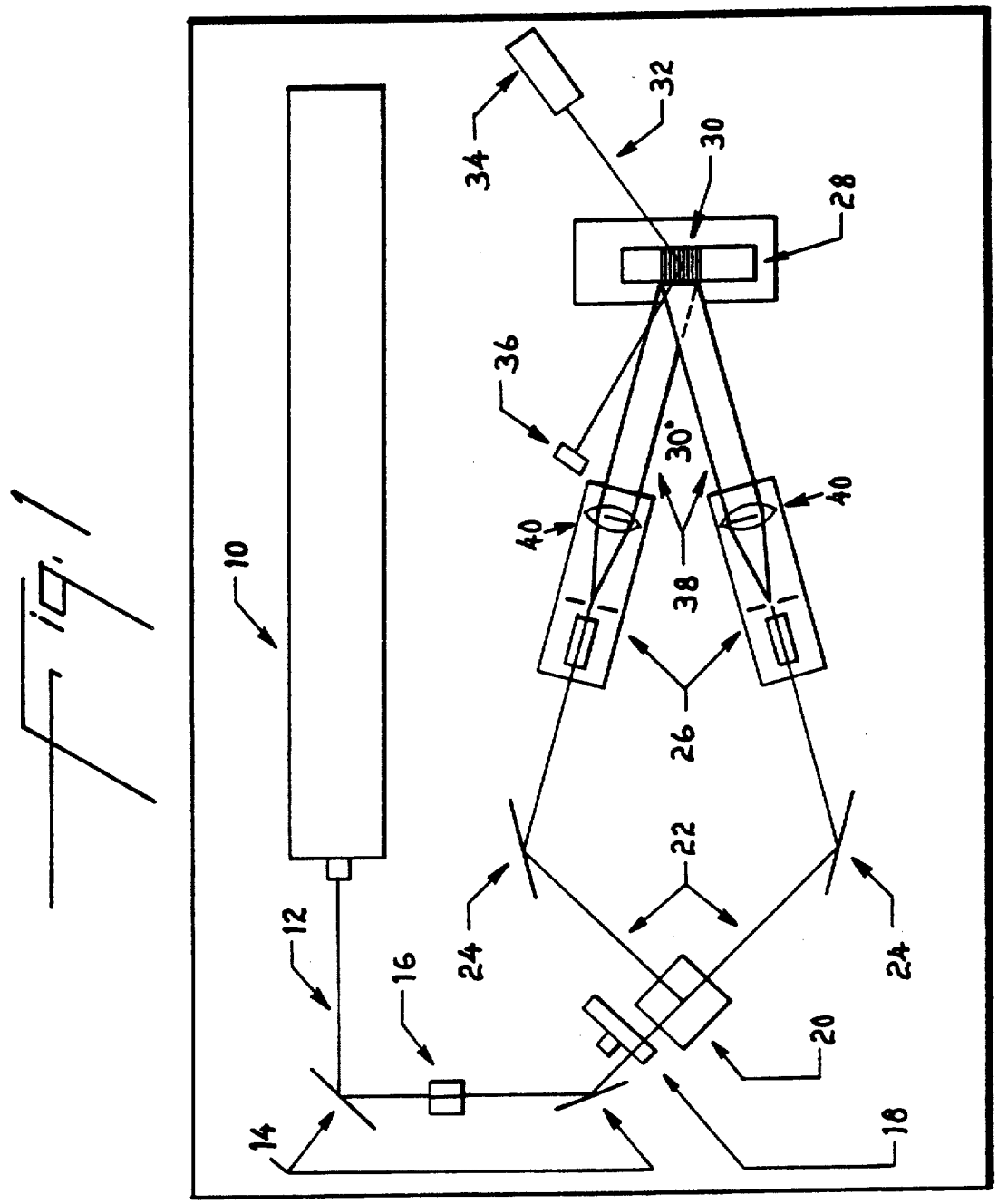

STORAGE STABLE PHOTOPOLYMERIZABLE COMPOSITION AND ELEMENT FOR REFRACTIVE INDEX IMAGING

CROSS REFERENCE TO RELATED APPLICATIONS

This Application is a continuation-in-part of Ser. No. 07/144,281 filed Jan. 15, 1988, now abandoned.

FIELD OF THE INVENTION

This invention relates to solid imaging compositions and elements which, after exposure, contain image areas having an index of refraction which is different from that of non-image areas. More particularly this invention relates to such systems wherein the refractive index image is a hologram.

DISCUSSION OF THE BACKGROUND AND PRIOR ART

The term "image recording" is conventionally taken to mean a process which produces a spatial pattern of optical absorption in the recording medium. Photographic processes are well known examples of this type of process.

In a broader sense, however, the word "image" means a spatial variation of the optical properties of a sample in such a way as to cause a desired modification of a beam of light passing through the sample. Refractive index images in general, and holograms in particular, which modulate the phase, rather than the amplitude, of the beam passing through them, are usually referred to as phase holograms. Phase holographic image recording systems produce a spatial pattern of varying refractive index rather than optical absorption in the recording medium and, thus, can modulate a beam of light without absorbing it.

This type of refractive index image also includes a number of optical elements or devices which superficially bear little resemblance to absorption images. Examples are holographic lenses, gratings, mirrors, and optical waveguides.

Holography is a form of optical information storage. The general principles are described in a number of references, e.g., "Photography by Laser" by E. N. Leith and J. Upatnieks in SCIENTIFIC AMERICAN, 212, No. 6,24–35 (June, 1965). A useful discussion of holography is presented in "Holography", by C. C. Guest, in *Encyclopedia of Physical Science and Technology*, Vol. 6, pp. 507–519, R. A. Meyers, Ed., Academic Press, Orlando, Fla., 1987. In brief, the object to be photographed or imaged is illuminated with coherent light, e.g., from a laser, and a light sensitive recording medium, such as a photographic plate, is positioned so as to receive light reflected from the object. Each point on the object reflects light to the entire recording medium, and each point on the recording medium receives light from the entire object. This beam of reflected light is known as the object beam. At the same time, a portion of the coherent light is beamed by a mirror directly to the recording medium, bypassing the object. This beam is known as the reference beam. What is recorded on the recording medium is the interference pattern that results from the interaction of the reference beam and the object beam impinging on the medium. When the processed recording medium is subsequently illuminated and observed appropriately, the light from the illuminating source is diffracted by the hologram to reproduce the wave-front that originally reached the recording medium from the object, so that the hologram resembles a window through which the virtual image of the object is observed in full three-dimensional form, complete with parallax.

Holograms that are formed by allowing the reference and object beams to enter the recording medium from the same side are known as transmission holograms. Interaction of the object and reference beams in the recording medium forms fringes of material with varying refractive indices which are normal or near normal to the plane of the recording medium. When the hologram is played back by viewing with transmitted light, these fringes refract the light to produce the viewed virtual image. Such transmission holograms may be produced by methods which are well known in the art such as disclosed in U.S. Pat. No. 3,506,327; U.S. Pat. No. 3,838,903 and U.S. Pat. No. 3,894,787.

Holograms formed by allowing the reference and object beams to enter the recording medium from opposite sides, so that they are traveling in approximately opposite directions are known as reflection holograms. Interaction of the object and reference beams in the recording medium forms fringes of material with varying refractive indices which are, approximately, planes parallel to the plane of the recording medium. When the hologram is played back, these fringes act as mirrors reflecting incident light back to the viewer. Hence, the hologram is viewed in reflection rather than in transmission. Since the wavelength sensitivity of this type of hologram is very high, white light may be used for reconstruction. Reflection holograms may be produced by an on-axis method wherein the beam of coherent radiation is projected through the recording medium onto an object therebehind. In this instance, the reflected object beam returns and intersects with the projected beam in the plane of the recording medium to form fringes substantially parallel to the plane of the medium.

A diffraction grating is the simplest possible transmission hologram. It is the hologram of two coherent plane waves. It can be created by splitting a single laser beam and recombining the beams at the recording medium.

The interference pattern produced by two plane waves which are coherent and are not polarized perpendicular to each other is a set of uniformly spaced fringes with a sinusoidal intensity distribution. When incident on a recording medium they produce a set of uniformly spaced fringes which have a sinusoidal variation in refractive index, generally referred to as a grating, oriented parallel to the bisector of the angle between the two beams. If the two waves are incident at equal angles with respect to the surface of the recording medium and are both incident on the same side of the recording medium, the fringes are perpendicular to the surface of the medium and the grating is said to be unslanted. The hologram grating produced is said to be a transmission grating since light passing through it is diffracted. The grating is said to be thick if it is much thicker than the distance between the fringes, generally referred to as the grating spacing.

A diffraction grating can be characterized by its diffraction efficiency, that is the percent of incident radiation which is diffracted, and by its thickness. A simple but useful theory for thick hologram gratings, generally known as the "coupled wave theory", has been developed by Kogelnik (H. Kogelnik, Coupled wave theory for thick hologram gratings, *Bell Syt. Tech. J.*, 48, 2909–2947, 1969). This theory treats the relationship between diffraction efficiency, grating thickness, wavelength of incident radiation, and the angle of incident radiation. A useful discussion of this theory in regard to refractive index recording systems has been presented in Section II of an article by Tomlinson and Chandross (W. J. Tomlinson and E. A. Chandross, Organic photochemical refractive-index image recording systems, *Adv. in Photochem.*, Vol. 12, J. N. Pitts, Jr., G. S. Hammond, and K. Gollinick, eds., Wiley-Interscience, New York, 1980, pp 201–281).

Refractive index modulation is a quantitative measure of the change in refractive index between image and non-image portions of a hologram or other recording medium containing a refractive index image. For the diffraction grating, refractive index modulation is the measure of the amplitude of the sinusoidal modulation of the refractive index within the recording medium produced when the holographic image is recorded. The refractive index modulation, or index modulation, for a recording medium is best determined by holographically forming a grating in the medium and calculating the index modulation using Kogelnik's coupled wave theory and the measured parameters of the grating formed, i.e., the diffraction efficiently, medium thickness, etc.

A holographic mirror is the simplest possible reflection hologram. It can be created by splitting a single laser beam and recombining the beams at the recording medium, or the unsplit laser beam can be projected through the medium onto a plane mirror therebehind. A set of uniformly spaced fringes with a sinusoidal-like intensity distribution is formed which are oriented parallel to the bisector of the obtuse angle between the two beams propagating in the recording medium. If the obtuse angle is 180° and the beams are normal to the plane of the medium, the fringes will be parallel to the plane of the medium. If the two beams do not make equal angles with the normal to the plane of the medium, then the fringes which are formed will be slanted at an acute angle relative to the plane of the medium. The holographic mirror can be characterized by its wavelength of maximum reflection and by its reflection efficiency, that is the percent of incident radiation which is reflected at its wavelength of maximum reflection.

A variety of materials have been used to record volume holograms. Among the more important are: silver halide emulsions, hardened dichromated gelatin, ferroelectric crystals, photopolymers, photochromics and photodichroics. Characteristics of these materials are given in *Volume Holography and Volume Gratings*, Academic Press, New York, 1981 Chapter 10, pp. 254–304 by L. Solymar and D. J. Cook.

Dichromated gelatin is the material most widely used for recording volume holograms. This material has become the popular choice because of its high diffraction efficiency and low noise characteristics. However, the material has poor shelf life and requires wet processing. Plates must be freshly prepared, or prehardened gelatin must be used. Wet processing means that an additional step is required in hologram preparation and may also cause the hologram to change due to swelling and then shrinkage of the gelatin during processing. The requirement that plates by freshly prepared each time a hologram is made, plus the problems associated with wet processing, make reproducibility extremely difficult to achieve with dichromated gelatin.

While early holograms where prepared from silver halide, liquid photopolymers, or dichromated colloids which required several processing steps, solid photopolymerizable elements were proposed which require only a single process step. U.S. Pat. 3,658,526, to Haugh discloses preparation of stable high-resolution holograms from solid photopolymerizable layers by a single step-process wherein a permanent refractive index image is obtained by a single imagewise exposure of the photopolymerizable layer to actinic radiation bearing holographic information. The holographic image formed is not destroyed by subsequent uniform actinic exposure, but rather is fixed or enhanced.

Although the solid photopolymerizable layers proposed by Haugh offer many advantages over the prior art, their efficiency is low. These layers typically have a refractive index of modulation in the range of 0.001 to 0.003. As a result, reconstructed holographic images formed in thin layers of the photopolymer only have limited brightness. While brightness can be increased by employing thicker layers of the photopolymer, this solution results in a substantial reduction to the viewing angle and causes the manufacturer to use much more of the expensive photopolymer. It also should be noted that the coated layers proposed by Haugh generally cannot be stored at room temperature for extended times without loss of speed and diffraction efficiency. Thus, there continues to be a need for improved photopolymer compositions and elements for refractive index imaging applications, including holography.

SUMMARY OF THE INVENTION

This invention provides storage stable, solid, photopolymerizable compositions containing N-vinyl carbazole and hexaarylbiimidazoles that have improved response to actinic radiation and produce holograms of improved brightness. More particularly, this invention provides a substantially solid, storage stable photopolymerizable composition that forms a refractive-index image upon exposure to actinic radiation as the sole processing step, said composition consisting essentially of:

(a) a solvent soluble, thermoplastic polymeric binder;
(b) N-vinyl carbazole; and
(c) a hexaarylbiimidazole photoinitiator system having a hydrogen donor component, wherein the hydrogen donor component is a mercapto compound having a $pK_{HNP}$ greater than 8.0, as measured in methanol with a glass electrode calibrated with aqueous buffer.

In a preferred embodiment of this invention, the composition contains a liquid ethylenically unsaturated monomer which contains a substituent selected from the group, phenyl, phenoxy, naphthyl, naphthyloxy, heteroaromatic group containing up to three aromatic rings, chlorine, bromine, and mixtures thereof and the polymeric material is substantially free of said substituents. In a further embodiment of this invention, the solid photopolymerizable composition also contains a liquid plasticizer.

The composition generally will be supported on a substrate, such as polyethylene terephthalate film, to make a recording element that is useful in recording refractive index images, such as holograms. Typically the image will exhibit a refractive index modulation of at least 0.005 as determined using the procedure described hereinafter, and thus produce a bright hologram having a broad viewing angle when exposed to actinic radiation. The term "actinic radiation" as used herein refers to a coherent light source, such as a laser, that will initiate photopolymerization to record interference fringes in the composition.

BRIEF DESCRIPTION OF THE DRAWING

The Figure illustrates the experimental arrangement used to holographically determine the refractive index modulation.

DETAILED DESCRIPTION OF THE INVENTION

The improved photopolymerizable compositions of this invention are substantially solid and are typically used as a layer applied to a permanent substrate. The composition may be directly coated onto the substrate by any conventional method or may be laminated thereto as a storage stable, preformed element comprising the photopolymerizable layer releasably adhered to a temporary support film, e.g., of polyethylene terephthalate.

The photopolymerizable layer is a thermoplastic composition which, upon exposure to actinic radiation, forms crosslinks or polymers of higher molecular weight to change the refractive index and rheological character of the composition. Preferred photopolymerizable compositions are compositions wherein free radical addition polymerization and crosslinking of a compound containing one or more ethylenically unsaturated groups, usually in a terminal position, hardens and insolubilizes the composition. The sensitivity of the photopolymerizable composition is enhanced by the photoinitiating system which may contain a component which sensitizes the composition to practical radiation sources, e.g., visible light.

Conventionally a binder is the most significant component of a substantially dry photopolymerizable film or layer, in determining what physical properties the film or laminate will have while being used. The binder serves as a containing medium for the monomer and photoinitiator prior to exposure, provide the base line refractive index, and after exposure contributes to the physical and refractive index characteristics needed for the refractive index image formed. Cohesion, adhesion, flexibility, miscibility, tensile strength, in addition to index of refraction are some of the many properties which determine whether a binder is suitable for use in a refractive index media.

Dry film photopolymerizable elements of various types may be used. Suitable elements are prepared by conventionally coating the photopolymerizable composition on a wide variety of transparent substrates. By "substrate" is meant any natural or synthetic support, preferably one which is capable of existing in a flexible or rigid film or sheet form. For example, the substrate could be a sheet or film of synthetic organic resin, or a composite of two or more materials. Specific substrates include polyethylene terephthalate films such as resin-subbed or electrostatic discharge-treated polyethylene terephthalate film, glass, cellulose acetate film, and the like. The particular substrate will generally be determined by the application involved.

While the photopolymerizable layer is a solid sheet of uniform thickness, it is composed of at least three major components: (a) a solid, solvent soluble, thermoplastic polymeric binder; (b) N-vinyl carbazole; and, (c) a hexaarylbiimidazole photoinitiator system containing a mercapto hydrogen donor component having a relative acidity constant, $pK_{HNP}$, greater than 8.0, when measured in methanol with a glass electrode calibrated with aqueous buffer. The term "N-vinyl carbazole" as used herein includes equivalent substituted and derivative compounds of N-vinyl carbazole wherein the added substituent(s) do not unduly detract from the favorable results achieved through use of the parent compound.

The layer also typically contains at least one liquid ethylenically unsaturated monomer capable of addition polymerization to produce a polymeric material with a refractive index substantially different from that of the preformed polymeric material. Although the layer is a solid composition, components interdiffuse before, during and after imaging exposure until they are fixed or destroyed by a final uniform treatment, usually by a further uniform exposure to actinic radiation. Interdiffusion may be further promoted by incorporation into the composition of an otherwise unreactive plasticizer. In addition to N-vinyl carbazole, the composition may contain other solid monomer components capable of interdiffusing in the solid composition and reacting with N-vinyl carbazole or liquid monomer, if present, to form a copolymer with a refractive index shifted from that of the preformed polymeric material.

In the composition of this invention the initiator system comprises a hexaarylbiimidazole initiator and a mercapto hydrogen donor agent and may contain a sensitizer which extends the spectral response into regions having special utility, e.g., the near U.V. region, and the visible and near infrared spectral regions where lasers emit.

Suitable free radical-generating addition polymerization initiators activatable by actinic light and thermally inactive at and below 185° C. are hexaarylbiimidazole compounds, also known as 2,4,5-triphenylimidazolyl dimers, as described in U.S. Pat. Nos. 3,427,161; 3,479,185; 3,549,367; 3,784,557; 4,311,783; and 4,622,286. Preferred photoinitiators include CDM-HABI, i.e., 2-(o-chlorophenyl)-4,5-bis(m-methoxyphenyl)imidazole dimer; o-Cl-HABI, i.e., 1,1'-biimidazole, 2,2'-bis (o-chlorophenyl)-4,4',5,5'-tetraphenyl-; and TCTM-HABI, i.e., 1H-imidazole, 2.5-bis (o-chlorophenyl)-4-(3,4-dimethoxyphenyl)-, dimer.

Hydrogen donors of this invention are mercapto compounds which have a relative acidity constant, $pK_{HNP}$, greater than 8.0, when measured in methanol with a glass electrode calibrated with aqueous buffer. Relative acidity constants, also known as half-neutralization potentials, are more fully described in *Lange's Handbook of Chemistry*, 12th edition, McGraw-Hill, New York (1979), pages 5-44 to 5-46, and in *Quantitative Chemical Analysis* by I. M. Koltholff, E. B. Sandell, E. J. Mechan & S. Brukenstein, 4th edition, Macmillian, New York (1969), page 712. In brief, the glass electrode of a pH meter is calibrated against a series of aqueous buffers. The mercapto compound, dissolved in methanol, is titrated with an appropriate base, and the potential at which the mercapto compound is 50% neutralized measured with the glass electrode. The relative acidity constant, $pK_{HNP}$, is determined from the previously measured calibration curve. Mercapto compounds useful as hydrogen donors may be aliphatic, aromatic or heterocyclic compounds. Preferred mercapto compounds which meet these criteria include:

5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; or 1-dodecanethiol.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. Particularly preferred sensitizers include the following:

DBC, i.e., Cyclopentanone, 2,5-bis ([4-(diethylamino)-2-methylphenyl]-methylene); DEAW, i.e, Cyclopentanone, 2,5-bis{[4-(diethylamino)-phenyl] methylene}; dimethoxy-JDI, i.e., 1H-inden-1-one, 2,3-dihydro-5,6-dimethoxy-2-[(2,3,6,7-tetra-hydro-1H,5H-benzo [i,j] quinolizin-9-yl)methylene]-; and JAW, i.e., cyclopentanone, 2,5- bis[(1H,5H-benzo[i,j]quinolizin-1-yl)methylene]-.

which have the following structures respectively:

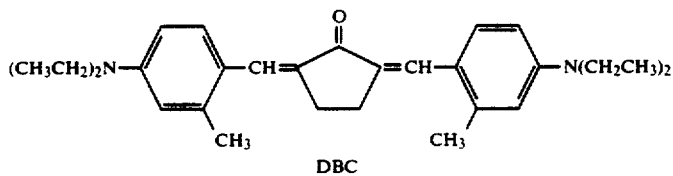
DBC

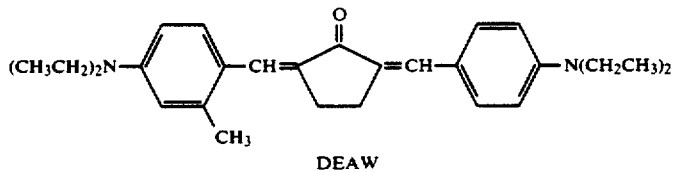
DEAW

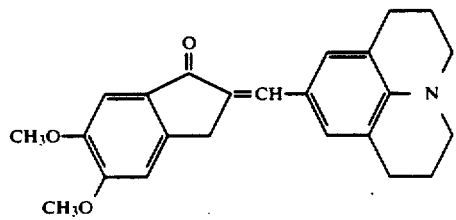
Dimethoxy-JDI

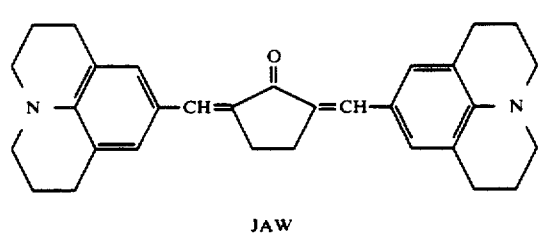
JAW

The refractive index shift resulting from imaging polymerization of the monomer of the composition is best measured as the refractive index modulation as calculated from the parameters of a grating formed holographically in a layer of the composition. This measurement is achieved using the 30° holographic grating system illustrated in the Figure. In the system an argon ion laser (10) operating at 488 nm and $TEM_{oo}$ produces a laser beam (12) which is directed by mirrors (14) and a beam elevator (16) through an attenuator (18) and into a beam splitter (20) wherein the beam is divided into two approximately equal beam segments (22). Each beam segment (22) is reflected by a mirror (24), through a spatial filter (26) and a collimating lens (40) to converge in the plane of glass mounted sample (28) to subtend an angle of about 30° whose bisector is approximately normal to the plane of the sample (28) so as to form a grating hologram (30). Grating (30) formation is measured in real time by passing a 632.8nm beam (32) from a He:Ne laser (34) through the center of the exposure area at the Bragg angle. The intensity of the laser beam (32) diffracted by sample (28) is monitored with a detector (36).

To determine refractive index modulation, a film element is prepared comprising a flexible transparent polyethylene terephthalate support sheet having coated thereon a solid photopolymerizable layer about 10 to 60 $\mu m$ thick which optionally is protected with a polypropylene, polyethylene, or polyethylene terephthalate cover sheet. A section of the film element is cut, the cover sheet removed, if present, and then mounted onto a 4×5 inch glass plate by hand laminating the uncovered layer surface to the glass surface. Even though the layer is solid its surface typically is tacky and adheres readily to the glass surface. In those instances where tack is absent, heat and pressure may be used to laminate the photopolymerizable layer to the glass substrate surface. Typically the polyethylene terephthalate film support is left in place on the laminate and serves to protect the layer during handling and exposure operations.

The glass mounted photopolymerizable layer (28) is evaluated in the 30° holographic grating system described above wherein the emerging collimated beam (38) intensity ratio is maintained at about 1:1, with absolute intensities ranging from 3–10 $mW/cm^2$ per beam (38). The diameter of each emerging beam (38) is about 1 cm. The photopolymerizable layer (28) is exposed for about 4-32 seconds to the modulated laser radiation at the convergence of beams (38) corresponding to about 50-600 mJ/cm² total exposure. About one minute after this imagewise exposure the grating is reexposed for 1-2 minute using one of the two emerging beams (38) to fix or complete polymerization throughout the photopolymerizable layer (28). As described earlier, grating (30) formation is monitored using the non-actinic 632.8 nm beam (32) of a He:Ne laser (34) and a detector (36) which is a Coherent model 212 power meter attached to a strip chart recorder. Diffraction efficiency ($\eta$) is calculated as the ratio of the diffracted beam intensity ($I_{diff}$) to the pre-exposure undiffracted beam intensity ($I_o$) after passing through the coating:

$$\eta = I_{diff}/I_o \qquad (1)$$

Coating thickness is measured for the photocured sample using a conventional thickness measuring system.

The refractive index modulation in the recorded grating is calculated from the measured diffraction efficiency and coating thickness using Kogelnik's coupled wave theory, which for unslanted transmission diffraction gratings gives:

$$M = \frac{\lambda \cos\theta_o \sin^{-1}(\eta)^{\frac{1}{2}}}{\pi d} \qquad (2)$$

Where:
M = refractive index modulation
$\lambda$ = probe radiation wavelength in freespace (632.8 nm)
$\theta_o$ = angle within the recording medium between the probe radiation and a line perpendicular to the plane of the medium ($\theta_o = 12.93°$ for $\lambda = 632.8$ nm)
$\eta$ = diffraction efficiency of the grating
d = grating thickness The internal angle $\theta_o = 12.93°$ of the probe beam within the recording medium is calculated from the external angle $\theta = 15°$ between the line normal to the film plane and the 488 nm recording beams using Snell's law:

$$\sin\theta = n_o \sin\theta_o \qquad (3)$$

and Bragg's law:

$$2\Lambda \sin\theta_o = \lambda/n_o \qquad (4)$$

where $\Lambda$ is the fringe spacing and $n_o$ is the average refractive index of the medium. A value of 1.50 for $n_o$ is used in all calculations.

The improved solid, photopolymerizable compositions of this invention which produced acceptably bright and sharp transmission holograms have a refractive index modulation, M, which is at least about 0.005 as calculated using this procedure and system. Holographic gratings prepared and measured using the procedure specified above typically have a special frequency of about 1000 lines per mm, i.e., between 900 and 1100 lines per mm. For the purpose of this invention refractive index modulation is defined as the refractive index modulation as measured with 632.8 nm probe radiation from a transmission grating having a spatial frequency of about 1000 lines per mm as prepared by the specified procedure.

Suitable monomers which can be used in combination with N-vinyl carbazole include but are not limited to styrene, 2-chlorostyrene, 2-bromostyrene, methoxystyrene, phenyl acrylate, p-chlorophenyl acrylate, 2-phenylethyl acrylate, 2-phenoxyethyl acrylate, 2-phenoxyethyl methacrylate, phenol ethoxylate monoacrylate, 2-(p-chlorophenoxy)ethyl acrylate, benzyl acrylate, 2-(1-naphthyloxy)ethyl acrylate, 2,2-di(p-hydroxyphenyl)propane diacrylate or dimethacrylate, 2,2-di-(p-hydroxyphenyl)propane dimethacrylate, polyoxyethyl-2,2-di-(p-hydroxyphenyl)propane dimethacrylate, di-(3-methacryloxy-2-hydroxypropyl) ether of bisphenol-A, di-(2-methacryloxyethyl) ether of bisphenol-A, di(3-acryloxy-2-hydroxypropyl) ether of bisphenol-A, di(2-acryloxyethyl) ether of bisphenol-A, ethoxylated bisphenol-A diacrylate, di(3-methacryloxy-2-hydroxypropyl) ether of tetrachloro-bisphenol-A, di(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of diphenolic acid, 1,4-benzenediol dimethacrylate, 1,4-diisopropenyl benzene, 1,3,5-triisopropenyl benzene, hydroquinone monomethacrylate, and 2-[β-(N-carbazoyl)propionyloxy]ethyl acrylate.

Preferred liquid monomers for use in this invention are 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, di(2-acryloxyethyl)ether of bisphenol-A, ethoxylated bisphenol-A diacrylate, and 2-(1-naphthyloxy)ethyl acrylate.

These monomers may be used in admixture with a second solid monomer of the same type, e.g., ethylenically unsaturated carbazole monomers such as disclosed in *Journal of Polymer Science: Polymer Chemistry Edition*, Vol. 18, pp. 9-18 (1979) by H. Kamogawa et al., 2-naphthyl acrylate, pentachlorophenyl acrylate, 3,6-dibromo-9-vinyl carbazole, 2,4,6-tribromophenyl acrylate, bisphenol A diacrylate, 2-(2-naphthyloxy)ethyl acrylate, and N-phenyl maleimide.

The solvent soluble polymeric material or binder of this invention is substantially free of a substituent from the group consisting of phenyl, phenoxy, naphthyl, naphthyloxy, heteroaromatic group containing up to three aromatic rings, chlorine and bromine.

Suitable binders of this class, which are solvent soluble, thermoplastic polymers, can be used alone, or in combination with one another and include the following: acrylate and alpha-alkyl acrylate ester and acid polymers and interpolymers e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; saturated and unsaturated polyurethanes; butadiene and isoprene polymers and copolymers and high molecular weight polyethylene oxides of polyglycols having average molecular weights from about 4,000 to 1,000,000; epoxides, e.g., epoxides containing acrylate or methacrylate groups; polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, and ethyl cellulose, polycarbonates; polyvinyl acetal, e.g., polyvinyl butyral, polyvinyl formal. Acid containing polymers and copolymers functioning as suitable binder include those disclosed in U.S. Pat. No. 3,458,311 and in U.S. Pat. No. 4,273,857, as well as the amphoteric polymeric binders disclosed in U.S. Pat. No. 4,293,635 each of which is incorporated herein by reference. Particularly preferred binders for use in this invention are cellulose acetate butyrate polymers; acrylic polymers and inter polymers including polymethyl methacrylate, methyl methacrylate/methacrylic acid and methyl methacrylate/acrylic acid copolymers, terpolymers of methylmethacrylate/$C_2$–$C_4$ alkyl acrylate or methacrylate/acrylic or methacrylic acid; polyvinyl acetal, polyvinyl butyral, polyvinyl formal and interpolymer; and vinyl acetate polymer and interpolymer as well as mixtures thereof.

The solid, photopolymerizable compositions of this invention may contain a plasticizer. Plasticizers of this invention may be used in amounts varying from about 2% to about 25% by weight of the composition preferably 5 to about 15 wt.%. Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, tributyl phosphate, tris(2-ethyl hexyl) phosphate, Brij ® 30 [$C_{12}H_{25}(OCH_2CH_2)_4OH$], and Brij ® 35 [$C_{12}H_{25}(OCH_2CH_2)_{20}OH$].

Many of these plasticizers can be expressed by the following general formulae:

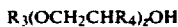

wherein each of $R_1$ and $R_2$ is alkyl group of 1 to 10 carbon atoms; $R_3$ is H or an alkyl group having 8 to 16 carbon atoms, $R_4$ is H or $CH_3$; x is 1 to 4; y is 2 to 20 and z is 1 to 20. Preferred plasticizers for use in cellulose acetate butyrate systems are triethylene glycol dicaprylate and tetraethylene glycol diheptanoate, diethyl adipate, Brij ®30 and tris-(2-ethylhexyl)phosphate.

Other plasticizers that yield equivalent results will be apparent to those skilled in the art, and may be employed in accordance with the invention. It also will be appreciated that plasticizers may be substituted for some or all of the liquid monomer in the event that a solid monomer is present, provided that the mixture of plasticizer and monomer(s) remain liquid. Other components in addition to those described above can be present in the photopolymerizable compositions in varying amounts. Such components include: optical brighteners, ultraviolet radiation absorbing material, thermal stabilizers, and release agents.

Optical brighteners useful in the process of the invention include those disclosed in Held U.S. Pat. No. 3,854,950, incorporated herein by reference. A preferred optical brightener is 7-(4'-chloro-6'-diethylamino-1',3',5'-triazine-4'-yl)amino-3-phenyl coumarin. Ultraviolet radiation absorbing materials useful in the invention are also disclosed in Held U.S. Pat. No. 3,854,950.

Useful thermal stabilizers include: hydroquinone, phenidone, p-methoxyphenol, alkyl and aryl-substituted hydroquinones and quinones, tert-butyl catechol, pyrogallol, copper resinate, naphthylamines, betanaphthol, cuprous chloride, 2,6-di-tert-butyl p-cresol, phenothiazine, pyridine, nitrobenzene, dinitrobenzene, p-toluquinone and chloranil. The dinitroso dimers described in Pazos U.S. Pat. No. 4,168,982 are also useful. Normally a thermal polymerization inhibitor will be present to increase stability in the storage of the photopolymerizable composition. Compounds which have been found useful as release agents are described in Bauer U.S. Pat. No. 4,326,010. A preferred release agent is polycaprolactone.

Amounts of ingredients in the photopolymerizable compositions will generally be within the following percentage ranges based on total weight of the photopolymerizable layer: monomer, 5–60%, preferably 5–25%; initiator 0.1–10%, preferably 1–5%; binder, 5–75%, preferably 45–65%; plasticizer, 0–25%, preferably 5–15%; other ingredients 0–5%, preferably 1–4%. If N-vinyl carbazole is the only ethylenically unsaturated monomer present, the binder may constitute up to approximately 95% of the total composition by weight.

The advantageous properties of the compositions of this invention can be observed by reference to the following examples.

EXAMPLES

Sample Preparation—General Procedure

Coating solutions without visible sensitizer, DEAW, were prepared under yellow or red light. After addition of DEAW, all operations on the solutions and their resulting coatings were performed under red light only. To further protect them from light, solutions were prepared and stored in amber bottles. Solution components were used as received from the manufacturer without purification, except for POEA which was chromatographed on aluminum oxide (activity-1) just prior to use.

Solutions were coated onto a 4-mil clear film support of polyethylene terephthalate at a web speed of about 4 to 8 fpm using a Talboy coater equipped with a 4-mil doctor knife, 12 foot drier set at 40–50° C., and a laminator station. A cover sheet of 1 mil polyethylene terephthalate film was laminated to the coatings after drying. Coated samples were stored in black polyethylene bags at room temperature until used.

Sample Evaluation—General Procedure

Coated film was cut into 4×5-inch sections, the cover sheet was removed, and the film then mounted by hand laminating the tacky coating directly to a glass plate. The polyethylene terephthalate film support was left in place and served to protect the coating during handling and exposure operations.

Glass mounted coatings were evaluated by recording holographic diffraction gratings and determining their efficiency. Gratings were obtained by actinic exposure at the intersection of two interfering collimated beams of an argon ion laser operating at 488 nm and $TEM_{oo}$ as illustrated in the Figure. The beam intensity ratio was maintained at about 1:1, with absolute intensities ranging from 1.5–7 mW/cm² per beam. The diameter of each beam was about 1 cm. Exposure times ranged from 8-32 seconds, corresponding to 72-600 mJ/cm² total exposure. About one minute after the image-wise exposure just described, each grating was given a 1-2 minute fixing exposure using one of the two 488 nm laser beams. Grating formation was measured in real time by passing a 632.8 nm He:Ne laser beam through the center of the exposure area at the Bragg angle. The intensity of the He:Ne laser beam was monitored with a Coherent model 212 power meter attached to a strip chart recorder. Diffraction efficiency ($\eta$) was calculated as the ratio of the diffracted beam intensity ($I_{diff}$) to the pre-exposure undiffracted beam intensity ($I_o$) after passing through the coating:

$$\eta = I_{diff}/I_o$$

A series of exposure times was used so maximum $\eta$ could be determined. Coating thicknesses were measured on photocured samples using a Brown & Sharpe Model 975 Electronic Comparator.

For each sample, the refractive index modulation in the recorded gratings was calculated from measured diffraction efficiencies and coating thicknesses using Kogelnik's coupled wave theory, previously described.

| | Glossary of Chemical Names |
|---|---|
| BHT | 2,6-Di-tert-butyl-4-methylphenol |
| CAB | Cellulose acetate butyrate |
| o-Cl-HABI | 1,1'-Biimidazole, 2,2'-bis[o-chlorophenyl]-4,4',5,5'-tetraphenyl-; CAS 1707-68-2 |
| CMBT | 5-Chloro-2-mercaptobenzothiazole; CAS 5331-91-9 |
| DDA | 1,10-Decanediol diacrylate |
| DDM | 1-Dodecanethiol; CAS 112-55-0 |
| DEAW | Cyclopentanone, 2,5-bis{[4-(diethylamino)-phenyl]methylene}; CAS 38394-53-5 |
| FC-430 | Fluorad ®430, liquid nonionic surfactant; 3M Company |
| JAW | Cyclopentanone, 2,5-bis[(1H,5H-benzo[i,j]quinolizin-1-yl)methylene]- |
| MBO | 2-Mercaptobenzoxazole; 2-Benzoxazolethiol; CAS 2382-96-9 |
| MBT | 2-Mercaptobenzothiazole; 2-Benzothiazolethiol; CAS 149-30-4 |
| MMT | 4-Methyl-4H-1,2,4-triazole-3-thiol; CAS 24854-43-1 |
| NPG | N-Phenyl glycine |
| NVC | N-Vinyl carbazole; 9-Vinyl carbazole; CAS 1484-13-5 |
| PMT | 1-Phenyl-1H-tetrazole-5-thiol; CAS 86-93-1 |
| POEA | 2-Phenoxyethyl acrylate; CAS 48145-04-6 |
| Vinac ® | Polyvinylacetate, Air Products, M.W. 500,000; CAS 9003-20-7 |
| TDC | Triethylene glycol dicaprylate |

Determining Relative Acidity Constants of Hydrogen Donors

The relative acidity constants of hydrogen donors were determined by measuring their half-neutralization potentials. Samples of hydrogen donors were dissolved in methanol and their half-neutralization potential measured potentiometrically using a Metrohm Model 636 Autotitrator equipped with a Mettler DG100 glass pH-electrode. The electrode was calibrated in aqueous buffer solutions at pH 4, 7, and 10; all subsequent titrations were carried out in methanol. The titrant was 0.1 N methanolic KOH. Half-neutralization potentials in methanol were also measured for acetic and benzoic acid, as controls. Results are presented below.

| Compound | Relative Acidity Constant ($pK_{HNP}$) |
|---|---|
| 1-Phenyl-1H-tetrazole-5-thiol (PMT) | 4.9 |
| N-Phenylglycine (NPG) | 6.3 |
| Benzoic acid | 7.0 |
| Acetic acid | 7.2 |
| 2-Mercaptobenzoxazole (MBO) | 7.9 |
| 5-Chloro-2-mercaptobenzothiazole (CMBT) | 8.2 |
| 2-Mercaptobenzothiazole (MBT) | 8.6 |
| 1H-1,2,4-Triazole-3-thiol | 9.0 |
| 6-Ethoxy-2-mercaptobenzothiazole | 9.1 |
| 4-Methyl-4H-1,2,4-triazole-3-thiol (MMT) | 9.7 |
| 1-Dodecanethiol (DDM) | >9.8[a] |

[a] Acid too weak to titrate, could not determine half-neutralization potential

EXAMPLE 1

This is a useful composition containing MMT hydrogen donor, NVC monomer, and CAB binder. Unexposed coatings of this composition have long shelf-life and are capable of recording transmission holograms with high refractive index modulation (M ≧ 0.013).

A formulation was prepared using 75.3 g dichloromethane and ingredients as described in the following table. The formulation was coated, exposed and evaluated according to the general procedures given above; results are presented in the table.

EXAMPLES 2-3

These are useful compositions identical to Example 1, except they contain either MBT or CMBT as the hydrogen donor. Unexposed coatings of these compositions have long shelf-life and are capable of recording transmissions holograms with high index modulation.

Two formulations were prepared, each containing 75.3 g dichloromethane, and each containing ingredients as described in Table 2. The formulations were coated, exposed, and evaluated as in Example 1; results are presented in the table below.

EXAMPLE 4

This composition is identical to Example 1, except it contains MBO as the hydrogen donor. Unexposed coatings of this composition have short shelf-life, but, when fresh, are capable of recording transmission holograms with high diffraction efficiency.

A formulation was prepared containing 75.3 g dichloromethane and ingredients as described in the table. The formulation was coated, exposed, and evaluated as in Example 1. Results are presented in the table.

| | Example Number | | | |
|---|---|---|---|---|
| Ingredients/Analysis | 1 | 2 | 3 | 4 |
| CAB 531-1, GRAMS (wt %) | 13.31 | 13.31 | 13.31 | 13.31 |
| | (53) | (53) | (53) | (53) |
| POEA, grams (wt %) | 5.52 | 5.52 | 5.52 | 5.52 |
| | (22) | (22) | (22) | (22) |
| NVC, grams (wt %) | 3.77 | 3.77 | 3.77 | 3.77 |
| | (15) | (15) | (15) | (15) |
| TDC, grams (wt %) | 1.76 | 1.76 | 1.76 | 1.76 |
| | (7) | (7) | (7) | (7) |
| o-Cl-HABI, grams (wt %) | 0.251 | 0.251 | 0.251 | 0.251 |
| | (1) | (1) | (1) | (1) |
| DEAW, grams (wt %) | 0.050 | 0.050 | 0.050 | 0.050 |
| | (0.2) | (0.2) | (0.2) | (0.2) |

-continued

| Ingredients/Analysis | Example Number | | | |
|---|---|---|---|---|
| | 1 | 2 | 3 | 4 |
| BHT, grams (wt %) | 0.003 (0.01) | 0.003 (0.01) | 0.003 (0.01) | 0.003 (0.01) |
| MMT, grams (wt %) | 0.45 (1.8) | — | — | — |
| MBT, grams (wt %) | — | 0.45 (1.8) | — | — |
| CMBT, grams (wt %) | — | — | 0.45 (1.8) | — |
| MBO, grams (wt %) | — | — | — | 0.45 (1.8) |
| Thickness, d, microns | 16.0 | 24.1 | 14.2 | 18.3 |
| Analysis 8 days after coating (freshly exposed samples) | | | | |
| Diff. Effic., η (%) | 87 | ~100 | 66 | 94 |
| Index Modulation, M | 0.015 | 0.015 | 0.013 | 0.014 |
| Analysis 95 days after coating (freshly exposed samples) | | | | |
| Diff. Effic., η (%) | 78 | 91 | 51 | 0.9 |
| Index Modulation, M | 0.013 | 0.010 | 0.011 | 0.0010 |
| Analysis 9 months after coating (freshly exposed samples) | | | | |
| Diff. Effic., η (%) | 62 | 94 | 48 | — |
| Index Modulation, M | 0.011 | 0.011 | 0.011 | — |

EXAMPLE 5

This is a useful composition containing MBT hydrogen donor, NVC monomer, and CAB binder. Unexposed coatings of this composition have long shelf-life and are capable of recording transmission holograms with high index modulation.

A formulation was prepared containing 75.0 g dichloromethane and ingredients as described below. The formulation was coated, exposed, and evaluated according to the general procedures given above; results are presented in the following table.

EXAMPLE 6

This is a useful composition containing DDM chain-transfer agent, NVC monomer, and CAB binder. Unexposed coatings of this composition have long shelf-life and are capable of recording transmission holograms with high index modulation.

A formulation was prepared containing 75.0 g dichloromethane and ingredients as described below. The formulation was coated, exposed, and evaluated as in Example 5; results are presented in the table.

| Ingredients/Analysis | Example Number | | | |
|---|---|---|---|---|
| | 5 | | 6 | |
| CAB 531-1 grams (wt %) | 13.25 | (53.0) | 13.25 | (52.8) |
| POEA, grams (wt %) | 5.50 | (22.0) | 5.50 | (21.9) |
| NVC, grams (wt %) | 3.75 | (15.0) | 3.75 | (15.0) |
| TDC, grams (wt %) | 1.75 | (7.0) | 1.75 | (7.0) |
| o-Cl-HABI, grams (wt %) | 0.25 | (1.0) | 0.25 | (1.0) |
| DEAW, grams (wt %) | 0.050 | (0.2) | 0.050 | (0.2) |
| BHT, grams (wt %) | 0.003 | (0.01) | 0.003 | (0.01) |
| MBT, grams (wt %) | 0.45 | (1.8) | — | |
| DDM, grams (wt %) | — | | 0.53 | (2.1) |
| Thickness, d, microns | 11.8 | | 13.6 | |
| Analysis 11 days after coating (freshly exposed samples) | | | | |
| Diffraction Efficiency, η (%) | 52 | | 54 | |

| Ingredients/Analysis | Example Number | |
|---|---|---|
| | 5 | 6 |
| Index Modulation, M | 0.013 | 0.012 |
| Analysis 9.7 months after coating (freshly exposed samples) | | |
| Diffraction Efficiency, η (%) | 33 | 33 |
| Index Modulation, M | 0.010 | 0.0088 |

EXAMPLES 7-8

These compositions contain NVC monomer and PMT, a thiol, or NPG, a non-thiol, as the hydrogen donor. Unexposed coatings of these compositions have short shelf-life.

Two formulations were prepared, each containing 75.0 g of dichloromethane, and each containing ingredients as described in the following table. The formulations were coated, exposed and evaluated according to the general procedures given above, except coating thicknesses were measured with a Sloan DEKTAK 3030 surface profile monitoring system and intensity of the diffracted light was obtained from the output of Fluka 8840A digital voltmeters attached to silicon photodiode sensors. Results are presented below.

| Ingredients/Analysis | Example Number | | | |
|---|---|---|---|---|
| | 7 | | 8 | |
| CAB 531-1, grams (wt %) | 13.25 | (53) | 13.25 | (53) |
| POEA, grams (wt %) | 5.50 | (22) | 5.50 | (22) |
| NVC, grams (wt %) | 3.75 | (15) | 3.75 | (15) |
| TDC, grams (wt %) | 1.75 | (7) | 1.75 | (7) |
| PMT, grams (wt %) | 0.45 | (1.8) | — | |
| NPG, grams (wt %) | — | | 0.45 | (1.8) |
| o-Cl-HABI, grams (wt %) | 0.25 | (1) | 0.25 | (1) |
| DEAW, grams (wt %) | 0.050 | (0.2) | 0.050 | (0.2) |
| BHT, grams (wt %) | 0.003 | (0.01) | 0.003 | (0.01) |
| Thickness, d, microns | 16 | | 15 | |
| Analysis 1-4 hours after coating | | | | |
| Diffraction Efficiency, η (%) | <0.1[a] | | 70 | |
| Index Modulation, M | <0.0004 | | 0.013 | |
| Analysis 6 days after coating (freshly exposed samples) | | | | |
| Diffraction Efficiency, η (%) | 0.1[a] | | 32 | |
| Index Modulation, M | 0.0004 | | 0.0086 | |
| Analysis 13-14 days after coating (freshly exposed samples) | | | | |
| Diffraction Efficiency, η (%) | 0.1[a] | | 32 | |
| Index Modulation, M | 0.0004 | | 0.0079 | |

[a]Hologram detectable, but very inefficient.

EXAMPLE 9

This example illustrates the formation of a reflection hologram from a composition containing JAW, NVC, and MMT.

A composition containing 16.21 g of Vinac® B100, 6.0 g POEA, 1.5 g NVC, 0.75 g o-Cl HABI, 0.50 g MMT, 0.025 g FC-430, 0.0025 g BHT, 0.015 g JAW, 6.0 g 2-butanone, and 69.0 g methylene chloride is coated onto a 0.004 inch thick clear film support of polyethylene terephthalate using a Talboy® coater equipped with an 0.008 inch doctor knife, 12 foot drier set at 40–50° C., and a laminator station. The coating speed is 8 ft/min. A cover sheet of 0.0009 inch polyethylene terephthalate is laminated to the coating as it came out of the drier. Cover sheet and film support were left in place during all subsequent handling, exposure, and processing operations.

A 4×5 inch sample of this material, sandwiched between a glass plate and an aluminized front-surface mirror, was exposed to a collimated 568 nm krypton-ion laser beam orientated perpendicular to the film plane and passing, in order, through the glass plate, film support, coating, and cover sheet and then, after reflecting off the mirror, back through back the cover sheet, coating, film support, and glass plate. The beam had a diameter of about 1.4 cm and an intensity of about 15 mW/cm$^2$. Exposure time was 20 sec corresponding to 300 mJ/cm$^2$ total exposure.

The imaged sample containing the holographic mirror was overall exposed to ultraviolet and visible radiation using a Douthitt type DCOP-X exposure unit (Douthitt Corporation, Detroit, MI) fitted with a photopolymer mercury arc lamp (Theimer-Strahler #5027). The sample was then heated to 100° C. for 15 min in a convection oven. The holographic mirror was analyzed by recording its transmission spectrum on a Hitachi Perkin-Elmer model 330 spectrophotometer. The maximum reflection efficiency was 87%, at 565 nm.

Having described the invention, I claim:

1. A substantially solid, storage stable, photopolymerizable composition suited for forming a refractive-index image upon exposure to actinic radiation as the sole processing step, said composition consisting essentially of:
   (a) approximately 25 to 95% of a solvent soluble, thermoplastic, polymeric binder;
   (b) approximately 5 to 40% of N-vinyl carbazole; and
   (c) approximately 0.1 to 10% of a hexaarylbiimidazole photoinitiator system having a hydrogen donor component, wherein the hydrogen donor component is a mercapto compound having a pK$_{HNP}$ greater than 8.0, as measured in methanol with a glass electrode calibrated with aqueous buffer.

2. The composition of claim 1 that will have a refractive index modulation of at least approximately 0.005 after exposure to actinic radiation.

3. The composition of claim 1 which also contains at least one liquid ethylenically unsaturated monomer capable of addition polymerization having a boiling point above 100° C.

4. The composition of claim 3 wherein the liquid monomer contains a substituent selected from the group consisting of phenyl, phenoxy, naphthyl, naphthyloxy, heteroaromatic containing up to three aromatic rings, chlorine and bromine and wherein the solvent soluble, thermoplastic, polymeric material is substantially free of said substituents.

5. The composition of claim 3 wherein the liquid monomer is selected from the group consisting of phenoxyalkyl acrylate or methacrylate; a phenol ethoxylate acrylate or methacrylate; a phenyl alkyl acrylate or methacrylate; 2-(1-naphthyloxy)ethyl acrylate; the di(2-acryloxyethyl)ether of bisphenol-A; and ethoxylated bisphenol-A diacrylate.

6. The composition of claim 3 wherein said binder is present in the amount of approximately 25 to 75%, N-vinyl carbazole is present in the amount of approximately 5 to 40% the ethylenically unsaturated monomers are present in the amount of approximately 5 to 60%, and said photoinitiator system is present in the amount of approximately 0.1 to 10% by weight, based on total weight of said composition.

7. The composition of claim 3 in which a solid ethylenically unsaturated monomer is also present.

8. The composition of claim 7 in which the solid ethylenically unsaturated monomer contains the carbazole group.

9. The composition of claim 7 wherein the solid ethylenically unsaturated monomer is selected from the group consisting of 3,6-dibromo-9-vinyl carbazole, 2,4,6-tribromophenyl acrylate or methacrylate, pentachlorophenyl acrylate or methacrylate, 2-naphthyl acrylate or methacrylate, 2-(2-naphthyloxy)ethyl acrylate or methacrylate, and the di-(2-acryloxyethyl)ether of tetrabromo-bisphenol A, and mixtures thereof.

10. The composition of claim 3 in which a plasticizer is also present, said plasticizer being selected from the group consisting of tris(2-ethylhexyl)phosphate, glyceryl tributyrate, and a compound having the general formula:

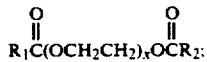

wherein each of R$_1$ and R$_2$ is an alkyl group of 1 to 10 carbon atoms; R$_3$ is H or an alkyl group of 8 to 16 carbon atoms, R$_4$ is H or CH$_3$; x is 1–4; y is 2–20 and z is 1–20.

11. The composition of claim 10 wherein the plasticizer is selected from the group consisting of triethylene glycol dicaprylate, triethylene glycol bis(2-ethylhexanoate), diethyl adipate, dibutyl adipate, tetraethylene glycol diheptanoate, dibutyl suberate, diethyl sebacate, tris(2-ethylhexyl)phosphate, and glyceryl tributyrate.

12. The composition of claim 10 in which said plasticizer is substituted for at least a portion of the liquid ethylenically unsaturated monomer.

13. The composition of claim 1 wherein said binder is selected from the group consisting of cellulose acetate butyrate; an acrylate or methacrylate polymer or interpolymer; a vinyl butyral, acetal or formal polymer or interpolymer; and a vinyl acetate polymer or interpolymer.

14. A substantially solid, storage stable, photopolymerizable composition that will have a refractive index modulation of at least approximately 0.005 after exposure to actinic radiation, said composition consisting essentially of:
   (a) approximately 25 to 95% of a solvent soluble, thermoplastic binder;
   (b) approximately 5 to 40% of N-vinyl carbazole;
   (c) approximately 5 to 60% of a liquid ethylenically unsaturated monomer capable of addition polymerization and having a boiling point above 100° C;
   (d) approximately 0 to 25% of a plasticizer; and
   (e) approximately 0.1 to 10% of a hexaarylbiimidazole photoinitiator system having a hydrogen donor component, wherein the hydrogen donor component is a mercapto compound having a pK$_{HNP}$ greater than 8.0, as measured in methanol with a glass electrode calibrated with aqueous buffer, said percentages being weight percentages of the total composition, and one of said binder or said liquid monomer containing a substituent selected from the group consisting of phenyl, phenoxy, naphthyl, naphthyloxy, heteroaromatic containing up to three aromatic rings, chlorine and bromine, and the other being substantially free of said substituents.

15. A substantially solid, storage stable element adapted to record a refractive index image upon exposure to actinic radiation as the sole processing step, said element comprising a substrate that supports a substantially solid, storage stable composition consisting essentially of:
(a) approximately 25 to 95% of a solvent soluble, thermoplastic, polymeric binder;
(b) approximately 5 to 40% of N-vinyl carbazole; and
(c) approximately 0.1 to 10% of a hexaarylbiimidazole photoinitiator system having a hydrogen donor component, wherein the hydrogen donor component is a mercapto compound having a pK$_{HNP}$ greater than 8.0, as measured in methanol with a glass electrode calibrated with aqueous buffer, said percentages being weight percentages of the total composition.

16. The recording element of claim 15 that will have a refractive index modulation of at least approximately 0.005 after exposure to actinic radiation.

17. The recording element of claim 16 wherein said composition also contains approximately 5 to 60% of at least one liquid ethylenically unsaturated monomer capable of addition polymerization and having a boiling point above 100° C., one of said binder or said liquid monomer containing a substituent selected from the group consisting of phenyl, phenoxy, naphthyl, naphthyloxy, heteroaromatic containing up to three aromatic rings, chlorine and bromine, and the other being substantially free of said substituents.

18. The recording element of claim 17 wherein said binder contains the substituent selected from the group consisting of phenyl, phenoxy, naphthyl, naphthyloxy, heteroaromatic containing up to three aromatic rings, chlorine and bromine, and said liquid monomer is substantially free of said substituents.

19. The recording element of claim 17 wherein said liquid monomer contains the substituent selected from the group consisting of phenyl, phenoxy, naphthyl, naphthyloxy, heteroaromatic containing up to three aromatic rings, chlorine and bromine, and said binder is substantially free of said substituents.

20. The recording element of claim 17 wherein said binder is present in the amount of approximately 25 to 75%, N-vinyl carbazole is present in the amount of approximately 5 to 40% the ethylenically unsaturated monomers are present in the amount of approximately 5 to 60%, and said photoinitiator system is present in the amount of approximately 0.1 to 10% by weight, based on total weight of said composition.

21. The recording element of claim 16 in which a solid ethylenically unsaturated monomer is also present in said composition.

22. The recording element of claim 21 in which the solid ethylenically unsaturated monomer contains the carbazole group.

23. The recording element of claim 21 wherein the solid ethylenically unsaturated monomer is selected from the group consisting of 3,6-dibromo-9-vinyl carbazole, 2,4,6-tribromophenyl acrylate or methacrylate, pentachlorophenyl acrylate or methacrylate, 2-naphthyl acrylate or methacrylate, 2-(2-naphthyloxy)ethyl acrylate or methacrylate, and the di-(2-acryloxyethyl)ether of tetrabromo-bisphenol A, and mixtures thereof.

24. The recording element of claim 16 in which a plasticizer is also present in said composition, said plasticizer being selected from the group consisting of tris(2-ethylhexyl)phosphate, glyceryl tributyrate, and a compound having the general formula:

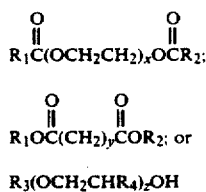

R$_3$(OCH$_2$CHR$_4$)$_z$OH wherein each of R$_1$ and R$_2$ is an alkyl group of 1 to 10 carbon atoms; R$_3$ is H or an alkyl group of 8 to 16 carbon atoms, R$_4$ is H or CH$_3$; x is 1–4; y is 2–20 and z is 1–20.

25. The composition of claim 24 wherein the plasticizer is selected from the group consisting of triethylene glycol dicaprylate, triethylene glycol bis(2-ethylhexanoate), diethyl adipate, dibutyl adipate, tetraethylene glycol diheptanoate, dibutyl suberate, diethyl sebacate, tris(2-ethylhexyl)phosphate, and glyceryl tributyrate.

26. The composition of claim 24 in which said plasticizer is substituted for at least a portion of the liquid ethylenically unsaturated monomer.

27. The recording element of claim 15 wherein said binder is selected from the group consisting of cellulose acetate butyrate; an acrylate or methacrylate polymer or interpolymer; a vinyl butyral, acetal or formal polymer or interpolymer; and a vinyl acetate polymer or interpolymer.

28. A substantially solid, storage stable element adapted to record a refractive index image upon exposure to actinic radiation as the sole processing step, said element comprising a substrate that supports a composition that will have a refractive index modulation of at least approximately 0.005 after exposure to actinic radiation, said composition consisting essentially of:
(a) approximately 25 to 95% of a solvent soluble, thermoplastic binder;
(b) approximately 5 to 40% of N-vinyl carbazole;
(c) approximately 5 to 60% of a liquid ethylenically unsaturated monomer capable of addition polymerization and having a boiling point above 100° C;
(d) approximately 0 to 25% of a plasticizer; and
(e) approximately 0.1 to 10% of a hexaarylbiimidazole photoinitiator system having a hydrogen donor component, wherein the hydrogen donor component is a mercapto compound having a pK$_{HNP}$ greater than 8.0, as measured in methanol with a glass electrode calibrated with aqueous buffer, said percentages being weight percentages of the total composition, and one of said binder or said liquid monomer containing a substituent selected from the group consisting of phenyl, phenoxy, naphthyl, naphthyloxy, heteroaromatic containing up to three aromatic rings, chlorine and bromine, and the other being substantially free of said substituents.

29. The composition of claim 1 wherein said hydrogen donor component is at least one mercapto compound selected from the group consisting of 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; and 1-dodecanethiol.

30. The composition of claim 14 wherein said hydrogen donor component is at least one mercapto compound selected from the group consisting of 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; and 1-dodecanethiol.

31. The recording element of claim 15 wherein said hydrogen donor component is at least one mercapto compound selected from the group consisting of 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; and 1-dodecanethiol.

32. The recording element of claim 28 wherein said hydrogen donor component is at least one mercapto compound selected from the group consisting of 5-chloro-b 2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; and 1-dodecanethiol.

* * * * *